(12) United States Patent
Kreinin et al.

(10) Patent No.: US 12,433,054 B2
(45) Date of Patent: Sep. 30, 2025

(54) BIFACIAL PHOTOVOLTAIC CELL MANUFACTURING PROCESS

(71) Applicant: SolAround Ltd., Jerusalem (IL)

(72) Inventors: Lev Kreinin, Bnei-Brak (IL); Ygal Eisenberg, Jerusalem (IL); Naftali Paul Eisenberg, Jerusalem (IL)

(73) Assignee: SolAround Ltd., Jerusalem (IL)

( * ) Notice: Subject to any disclaimer, the term of this patent is extended or adjusted under 35 U.S.C. 154(b) by 108 days.

(21) Appl. No.: 17/611,187

(22) PCT Filed: May 25, 2020

(86) PCT No.: PCT/IL2020/050572
§ 371 (c)(1),
(2) Date: Nov. 15, 2021

(87) PCT Pub. No.: WO2020/240544
PCT Pub. Date: Dec. 3, 2020

(65) Prior Publication Data
US 2022/0231183 A1 Jul. 21, 2022

Related U.S. Application Data

(60) Provisional application No. 62/857,286, filed on Jun. 5, 2019, provisional application No. 62/853,743, filed on May 29, 2019.

(51) Int. Cl.
*H10F 71/00* (2025.01)
*H10F 10/14* (2025.01)
(Continued)

(52) U.S. Cl.
CPC ......... *H10F 71/121* (2025.01); *H10F 10/148* (2025.01); *H10F 71/129* (2025.01);
(Continued)

(58) Field of Classification Search
CPC .. H10F 71/121; H10F 71/129; H10F 71/1224; H10F 10/148; H10F 77/311;
(Continued)

(56) References Cited

U.S. PATENT DOCUMENTS

2011/0132423 A1* 6/2011 Joge .................. H10F 71/00
257/E21.135
2011/0139231 A1* 6/2011 Meier ................ H01L 31/0682
257/E31.119
(Continued)

FOREIGN PATENT DOCUMENTS

CN 109192809 A * 1/2019 ....... H01L 31/02167
WO 2017/072758 5/2017

OTHER PUBLICATIONS

K. Wijekoon, T. Weidman, S. Paak and K. MacWilliams, "Production ready noval texture etching process for fabrication of single crystalline silicon solar cells," 2010 35th IEEE Photovoltaic Specialists Conference, Honolulu, HI, USA, 2010, pp. 003635-003641, doi: 10.1109/PVSC.2010.5614441 (Year: 2010).*
(Continued)

*Primary Examiner* — Sitaramarao S Yechuri
(74) *Attorney, Agent, or Firm* — Naomi S. Rosenman-Helfand

(57) ABSTRACT

A process for manufacturing a bifacial photovoltaic cell, comprising the steps: coating a substrate with a boron containing layer; forming a cap layer over the boron containing layer which is on the second surface of the substrate; removing the boron containing layer from the surfaces of the substrate which are not covered with a cap layer; effecting the deposition of a phosphorous containing layer on the surfaces of the substrate which are not covered by the cap layer, and effecting diffusion of the phosphorous and the boron into the substrate; removing the phosphorous containing layer; texturing the substrate where there is no cap layer;
(Continued)

effecting the deposition of a phosphorous containing layer on the first surface of the substrate and effecting diffusion of phosphorous into the substrate to form a second n-doped layer; and forming a passivating and/or antireflective coating layer covering the n-doped layer on the substrate's first surface.

13 Claims, 5 Drawing Sheets

(51) Int. Cl.
*H10F 77/30* (2025.01)
*H10F 77/70* (2025.01)

(52) U.S. Cl.
CPC ......... *H10F 77/311* (2025.01); *H10F 77/315* (2025.01); *H10F 77/703* (2025.01)

(58) Field of Classification Search
CPC ...... H10F 77/315; H10F 77/703; H10F 10/16; H10F 10/14; Y02E 10/547; Y02P 70/50; A01N 1/162; H10D 8/01; H10D 48/046; H10D 84/212; H10H 20/8264
See application file for complete search history.

(56) References Cited

U.S. PATENT DOCUMENTS

| | | | |
|---|---|---|---|
| 2014/0102531 A1* | 4/2014 | Moslehi | H01L 31/0512 |
| | | | 136/256 |
| 2015/0017747 A1 | 1/2015 | Lam et al. | |
| 2015/0372184 A1* | 12/2015 | Ogino | H10F 71/128 |
| | | | 438/57 |
| 2016/0240724 A1* | 8/2016 | Boescke | H01L 31/068 |
| 2017/0236953 A1* | 8/2017 | Dutta | H01L 31/02363 |
| | | | 136/256 |
| 2017/0301805 A1* | 10/2017 | Yamarin | H10F 77/20 |
| 2019/0109257 A1 | 4/2019 | Eisenberg et al. | |

OTHER PUBLICATIONS

Kreinin et al. ; "Industrially Fabricated Bifacial Si Solar Cells with n+-p-p+ Structure", Proceedings of 28th European Photovoltaic Solar Energy Conference 2013, p. 1835-1838.

Buck et al., "Industrial Screen Printed n-TYPE Silicon Solar Cells With Front Boron Emitter and Efficiencies Exceeding 17%"; Proceedings of 21st European Photovoltaic Solar Energy Conference 2006, p. 1264-1267.

Eisenberg et al. "Effective surface recombination of p+ layers doped using ion Implantation or surface deposited B sources", [Energy Procedia 2016, 92: p. 16-23].

* cited by examiner

Short circuit current density, Jsc, for one batch of cells.

Mean value Jsc = 39.76 mA/cm$^2$

Open circuit voltage, Voc, for one batch of cells.
Mean value Voc = 0.666 V

- Fill factor, FF, for one batch of cells.
Mean value FF = 77.35%

- Efficiency, $\eta$, for one batch of cells.
Mean value $\eta$ = 20.51%

BIFACIAL PHOTOVOLTAIC CELL MANUFACTURING PROCESS

FIELD OF THE INVENTION

The present invention related to the field of photovoltaic (PV) cells, particularly to the field of bifacial photovoltaic cells and processes for the manufacturing thereof.

BACKGROUND OF THE INVENTION

Increased energy consumption has caused concern over expected rapid depletion of existing energy sources, such as petroleum and coal. Thus, alternative energy sources, as alternatives to the existing energy sources, have been the focus of attention in recent years. Among the alternative energy sources, solar cells or photovoltaic cells are at the center of attention. PV silicon cells have been manufactured for many years. However, there still remain problems related to manufacturing cost, conversion efficiency and lifetime of the PV cell. The demand for increasing the efficiency of PV cells has given rise to various solutions. One such solution is the bifacial PV cell wherein both the front and the back of the PV cell are utilized in the energy conversion process. Bifacial PV cells are 15%-40% more energy productive than monofacial PV cells.

A common type of photovoltaic cell is based on a silicon substrate with p-type or n-type conductivity. The substrate is doped on one surface with an n-dopant (e.g., phosphorus) thus forming a $n^+$ layer, and the second surface is doped with a p-dopant (e.g., aluminum or boron) so as to form a $p^+$ layer. The processed p-type substrate thus forms a n+-p-p+ structure, and a n-type substrate forms a p+-n-n+ structure. It is a common procedure to treat the semiconductor substrates (wafers) before commencing the process of doping. The two most common pre-process treatments are saw damage removal wherein the mechanically induced defects of the substrate are removed, and the second common procedure is texturing of the substrate. Texturing creates micro pyramid-like shapes on the surface of the substrate, thus ultimately increasing the light absorption.

Adding electrical contacts to the PV cells enables current collection and are applied in various formats. Generally, said electrical contacts cover only a small fraction of the surface area in order to avoid impeding the passage of light. Electrical contacts are typically applied in a grid pattern in order to minimize covering of the surface area. Monofacial photovoltaic cells usually have such a grid pattern on only one side of the cell, whereas bifacial photovoltaic cells have such a pattern on both sides, and can therefore collect light from any direction.

Different methods of dopant source deposition are known. Gas phase processes using $POCl_3$ for phosphorus deposition and $BCl_3$ or $BBr_3$ for boron deposition are commonly used. Using 2 different dopant sources may easily result in doping of inappropriate regions, such as cross-doping of two dopant types in a single area. Additional steps involving deposition of protective layers and/or etching to remove dopant from some regions may be introduced which complicate cell fabrication.

Geminus™ bifacial cells line (Schmid Group) has been prepared using chemical vapor deposition (CVD) for depositing boron dopant-containing film.

To date, the best results in industrial production of p-type silicon-based bifacial cells were realized using a spin-on technique to deposit a dopant source.

The inventors have previously stated it would be desirable to achieve low effective back surface recombination (which may be facilitated in an n+-p-p+ structure by a back p+ layer), as well as high minority carrier bulk lifetime. It would be desirable to obtain p-type silicon-based bifacial cells using boron as a p-dopant for $p^+$ layer formation which have an effective back surface recombination of 55-95 cm/s, and an average back to front short circuit current ratio of 0.75.

Boron is a well-known p-dopant, and has the advantage of being sufficiently soluble in silicon, thereby allowing a higher p+-p barrier (in an n+-p-p+ structure) which is effective at reducing back surface recombination. However, boron diffusion is associated with considerable degradation of bulk lifetime, which reduces photovoltaic cell efficiency. This obstacle has encouraged the widespread use of aluminum as a p-dopant, although aluminum tends to be less effective than boron at reducing back surface recombination.

n-type silicon (in an n+-n-p+ structure) has also been used in order to reduce boron diffusion-associated degradation. Although n-type silicon is generally more resistant than p-type silicon to defects introduced by industrial processing, it is also more expensive.

There remains the need for PV cells of improved efficiency and processes for the manufacturing thereof that overcome the disadvantages of the prior art.

It is an objective of the present invention to provide a manufacturing process of a PV cell, a PV cell module and device which overcome the disadvantages of the prior art.

SUMMARY OF THE INVENTION

The present invention provides a process for the manufacturing of a bifacial photovoltaic cell comprising:
  a. Coating a substrate with a boron containing layer.
  b. Forming a cap layer over the boron containing layer which is on the second surface of said substrate.
  c. Removing said boron containing layer from the surfaces of said substrate which are not covered with a cap layer.
  d. Effecting the deposition of a phosphorous containing layer on the surfaces of said substrate which are not covered by said cap layer, and effecting diffusion of the phosphorous and the boron into the substrate.
  e. Removing said phosphorous containing layer.
  f. Texturing the substrate where there is no cap layer.
  g. Effecting the deposition of a phosphorous containing layer on the first surface of said substrate and effecting diffusion of phosphorous into the substrate to form a second n-doped layer.
  h. Forming a passivating and/or antireflective coating layer covering the n-doped layer on said substrate's first surface.

According to an embodiment of the invention there is provided a process for the manufacturing of a bifacial photovoltaic cell comprising further steps of removing said cap layer from said substrate's second surface (hereinafter "cap layer removal step") and forming a passivating and/or anti-reflective layer on substrate's second surface (hereinafter "second surface passivating step"), wherein cap removal step precedes second surface passivating and both of said steps can be conducted after step (f). Said process comprising the following steps:
  a. Coating a substrate with a boron containing layer.
  b. Forming a cap layer over the boron containing layer which is on the second surface of said substrate.

c. Removing said boron containing layer from the surfaces of said substrate which are not covered with a cap layer.

d. Effecting the deposition of a phosphorous containing layer on the surfaces of said substrate which are not covered by said cap layer, and effecting diffusion of the phosphorous and the boron into the substrate.

e. Removing said phosphorous containing layer.

f. Texturing the substrate where there is no cap layer, followed by the steps of: removing said cap layer from said substrate second surface, and forming a passivating and/or antireflective layer on substrate second surface.

g. Effecting the deposition of a phosphorous containing layer on the first surface of said substrate and effecting diffusion of phosphorous into the substrate to form a second n-doped layer.

h. Forming a passivating and/or antireflective coating layer covering the n-doped layer on said substrate's first surface.

In yet a further optional embodiment, step (a) is conducted with simultaneously partial drive-in of boron.

Further provided by the present invention is a process for the manufacturing of a bifacial photovoltaic cell comprising:

i. Forming a coated substrate wherein said substrate comprises an n-dopant containing layer on substrate's first surface wherein said n-dopant containing layer on substrate's first surface is coated with a cap layer.

ii. Effecting doping of the substrate with a p-dopant on the surfaces of said substrate which are not protected by the cap layer, concomitantly with effecting the drive-in (diffusion) into the substrate of the n-dopant from said n-dopant containing layer.

iii. Removing the cap layer from said first surface of the substrate.

iv. Forming a passivating and/or antireflective layer on the substrate's second surface.

v. Texturing the surface and edges of the substrate which are not covered by a passivating and/or antireflective layer.

vi. Effecting the deposition of a n-dopant containing layer on the first surface of said substrate and diffusion of said n-dopant into the substrate to form a second n-doped layer.

vii. Forming a passivating and/or antireflective layer on the first surface of the substrate.

The present invention further provides a photovoltaic cell wherein said photovoltaic cell is prepared according to the process of the present invention.

According to an aspect of some embodiments of the invention, there is provided a bifacial photovoltaic cell comprising a silicon substrate, said substrate comprising an $n^+$ layer on a first surface thereof and a $p^+$ layer on a second surface thereof, the $n^+$ layer comprising an n-dopant, preferably phosphorous and the $p^+$ layer comprising boron, wherein a surface concentration of boron in the second surface is less than $4.10^{20}$ atoms/cm$^3$.

Further provided by the present invention is a photovoltaic module comprising more than one of the photovoltaic cell described herein, wherein said more than one photovoltaic cells being interconnected to one another.

In yet a further embodiment of the invention, there is provided a power plant comprising the photovoltaic module described herein.

The present invention further provides an electric device comprising the photovoltaic cell described herein.

DETAILED DESCRIPTION OF THE INVENTION

Embodiments of the present invention relate to processes for the manufacturing of bifacial photovoltaic cells, PV cells, modules of PV cells and power plants and devices comprising said PV cells thereof. The specific conditions and sequence of the presently described process provides a bifacial photovoltaic cell of improved efficiency at front and rear illumination.

While researching and developing PV cells and processes for the manufacturing thereof, the inventors have found that the process described herein improves the performance of the PV cells obtainable by said process. The process of the present invention has a number of advantages over known methods of manufacturing bifacial solar cells. Examples of said advantages are: 1) Controlling the maximum concentration of boron doping; 2) Minimizing the formation of the B—Si compound which is responsible for the increased surface recombination; 3) According to certain embodiments, adjusting the boron doping profile, by carrying out simultaneously the deposition of the boron-containing layer together with the first stage of boron diffusion.

Figure 1:
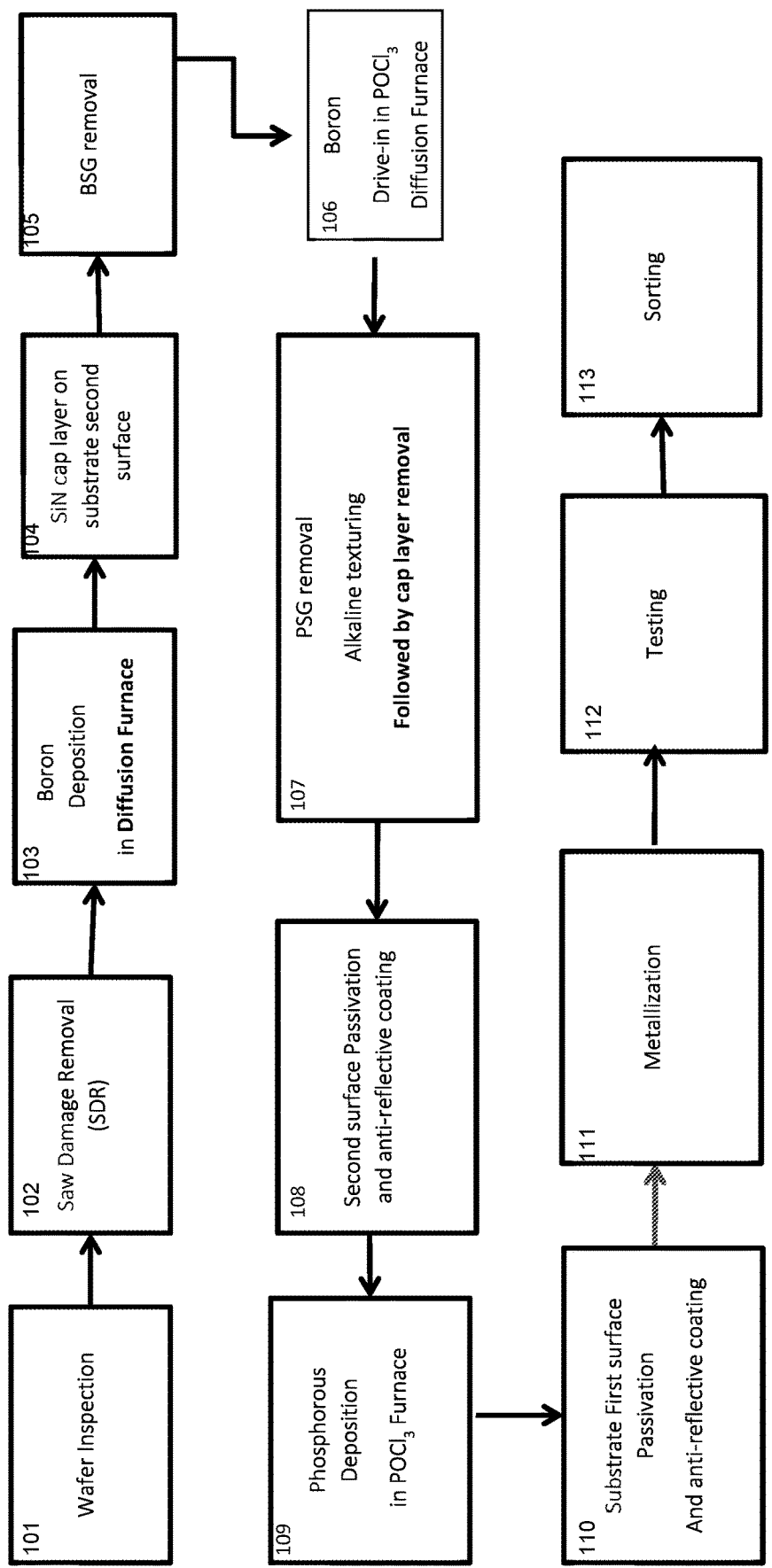
FIG. 1—A block diagram of the process (a) to (h).

The following description of embodiments of the invention is with reference to FIG. 1. Numbers in parenthesis e.g. (103) correlate to the block numbers in FIG. 1.

The present invention provides a process for the manufacturing of a bifacial photovoltaic cell comprising:

a. Coating a substrate with a boron containing layer.

b. Forming a cap layer over the boron containing layer which is on the second surface of said substrate.

c. Removing said boron containing layer from the surfaces of said substrate which are not covered with a cap layer.

d. Effecting the deposition of a phosphorous containing layer on the surfaces of said substrate which are not covered by said cap layer, and effecting diffusion of the phosphorous and the boron into the substrate.

e. Removing said phosphorous containing layer.

f. Texturing the substrate where there is no cap layer.

g. Effecting the deposition of a phosphorous containing layer on the first surface of said substrate and effecting diffusion of phosphorous into the substrate to form a second n-doped layer.

h. Forming a passivating and/or antireflective coating layer covering the n-doped layer on said substrate's first surface.

According to a preferred embodiment of the present invention there is provided a process for the manufacturing of bifacial PV cells comprising:
 a. Coating a substrate with a boron containing layer using $BCl_3$ or $BBr_3$ in the gas phase and effecting partial drive in of boron into said substrate (103).
 b. Forming a cap layer over the boron containing layer which is on the second surface of the said substrate (104).
 c. Removing the boron containing layer from the surfaces of the substrate which are not covered with a cap layer (105).
 d. Effecting the deposition of a phosphorous containing layer on the surfaces of said substrate which are not covered by said cap layer and effecting diffusion of the phosphorous and the boron into the substrate, wherein said deposition of said phosphorous containing layer is effected by using $POCl_3$ in the gas phase (106).
 e. Removing said phosphorous containing layer (107).
 f. Texturing the substrate's surfaces which are not covered with a cap layer, wherein said texturing also removes the boron and phosphorous doped substrate layers, followed by the steps of:
  removing said cap layer from said substrate second surface (107), and
  Forming a passivating and/or antireflective layer on said substrate's second surface (108).
 g. Effecting the deposition of a phosphorous containing layer on the first surface of said substrate and effecting diffusion of phosphorous into the substrate to form a second n-doped layer, wherein said deposition of said phosphorous containing layer is effected by using $POCl_3$ in the gas phase (109). Forming a coating layer covering the n-doped layer on the substrate's first surface wherein said coating layer is a passivating and/or antireflective layer (110).

According to a further embodiment of the invention the cap layer formed in step (b) may function as an antireflective and or passivating layer on the second surface of the substrate. In such an embodiment there is no need for cap layer removal and second surface passivating steps.

In another embodiment of the invention a step of chemical edge isolation is carried out after step (g) or step (h). Chemical edge isolation can be carried out according to any method known in the art. The terms "silicon substrate", "substrate" and "wafer" are used interchangeably and have the same meaning in the context of the present invention. The substrates which are suitable for use in the present invention can be selected from groups of silicon wafers with n or p type conductivity.

According to some embodiments of the present invention the substrate used in the process is a silicon wafer which undergoes pre-process treatment which includes inspection (101) and saw damage removal (102). According to certain embodiments of the present invention said substrate may also undergo texturing as a pre-process treatment. However, according to some embodiments said pre-process texturing is not necessary.

The term texturing refers to the operation of creating a texture of the surface of the substrate which can be carried out according to known methods in the art. Typically, texturing creates micro pyramid-like shapes on the surface of the substrate. Said texturing also can remove doped layers from the substrate.

The term drive-in refers to a process of diffusion wherein atoms of p-dopant and/or n-dopant diffuse from p and/or n dopant containing layers on the surface of the substrate into the substrate.

According to certain embodiments of the present invention suitable boron deposition techniques for forming a boron-containing layer are selected from among known boron deposition techniques. Non-limiting examples of said techniques are: chemical vapor deposition and physical vapor deposition. Gas phase deposition methods with $BBr_3$ or $BCl_3$ as boron carriers are the preferred techniques.

According to some embodiments of the invention during the step of boron deposition some diffusion of boron into the substrate can occur.

According to the present invention the deposition of boron occurs on all surfaces of the substrate.

Step (b) of forming a cap layer is carried out such that the cap layer coats the boron containing layer on the second surface of the substrate. Said cap layer is effected as described herein.

Herein the phrases "n-dopant containing layer" and "boron-containing layer" encompass layers containing the indicated ingredient (e.g., phosphorous, n-dopant and boron, p-dopant) and which are not part of the substrate (e.g., layers of a substance deposited onto a surface of the substrate).

In contrast, the phrase "n-doped layer" refers herein to a portion of the semiconductor substrate which has been doped with an n-dopant (e.g., upon diffusion of an n-dopant from an n-dopant containing layer into the substrate), and the phrase "boron-doped layer" refers herein to a portion of the semiconductor substrate which has been doped with boron (e.g., upon diffusion of boron from a boron-containing layer into the substrate).

In some embodiments a thickness of the boron-containing layer is in a range of from 1 to 80 nm (optionally from 2 to 80 nm). In some such embodiments, the thickness of the deposited layer is in the range of from 1 to 40 nm (optionally from 2 to 40 nm). In some such embodiments, the thickness of the deposited layer is in the range of from 1 to 20 nm (optionally from 2 to 20 nm).

In some embodiments a thickness of the boron-containing layer is selected such that the boron-containing layer contains an amount of boron (per surface area) which is suitable for providing a desired concentration of boron in a $p^+$ layer (according to any of the respective embodiments described herein) after effecting diffusion of boron (according to any of the respective embodiments described herein).

For any given composition of the boron-containing layer, a thickness (of the boron-containing layer) may readily be selected so as to provide a desired boron concentration.

According to some embodiments of the invention, subsequent to cap layer coating of the boron containing layer on the second surface, said boron containing layers on the substrate which are not protected by a cap layer, and can be on the surfaces and edges are removed by methods known in the art. A non-limiting example of said methods is etching in an HF water solution.

In some embodiments of the invention, subsequent to step (c), the substrate obtained is coated on the second surface with a boron containing layer that is coated with a cap layer. The other surfaces of the substrate, i.e. the first surface and the edges are clear from boron a containing layer According to some embodiments of the invention step (d) of the process comprises the deposition of a phosphorous containing layer and driving-in (diffusion) into the substrate of boron from the boron containing layer and phosphorous from the phosphorous containing layer.

According to specific embodiments of the invention, the deposition of a phosphorous containing layer can be effected by methods known in the art. Preferably, said phosphorous containing layer is effected by exposing the substrate to $POCl_3$ in the gas phase.

Drive-in (diffusion) into the substrate of the boron and phosphorous is effected using the temperature range of 700 to 1050° C., preferably at a temperature in the range of 750 to 1020° C.

In some embodiments of any of the embodiments described herein, forming an n-doped layer (steps (d) and (g)) is effected in two stages: first—forming on the surface of the substrate the phosphorous containing layer (which could be a phosphosilicate glass) for example under a $POCl_3$ containing gaseous atmosphere at moderate temperatures and second—diffusion of phosphorous into the substrate by elevating the temperature.

According to certain aspects of the invention the deposition of a phosphorous containing layer and the diffusion of the phosphorous into the substrates is simultaneous.

The phrase simultaneous in the meaning of step (d) and (g) of the present process refers to operations which occur in the same process stage. It is understood that at least initial deposition of the phosphorous containing layer is required before the diffusion of the n-dopant (phosphorous) commences.

In some embodiments of the present invention, subsequent to carrying out step (d), the substrate comprises a second surface coated with a boron containing layer which is protected by a cap layer, and a first surface and edges of the substrate coated with phosphosilicate glass (PSG) and containing n-doped layer with some boron impurities.

According to some embodiments of the invention the process further comprises a step (step (e)) of removing said PSG (where formed) and n-doped layers from all surfaces of the substrate (including edges) which are not protected by a cap layer. Said PSG and n-doped layers are removed by acidic etching and by alkaline texturing (step (f)) respectively (107).

In some embodiments, removing said first n-doped layer (e.g., an $n^+$ layer) on the first surface is effected so as to concomitantly remove any n-doped layer (e.g., n-doped islands) present elsewhere.

Methods of etching and texturing of the substrate are known in the art. In some embodiments, etching and texturing of (e.g., of an n-doped layer) is effected by an alkaline solution (e.g., a solution that comprises sodium hydroxide).

According to certain embodiments of the invention the cap layer is removed from the second surface of the substrate (cap layer removal step). Removal of the cap layer can be carried out according to methods known in the art. In some embodiments of the invention the cap layer is removed by HF solution etching.

In accordance with certain embodiments of the invention, subsequent to the removal of the cap layer from said second surface, said second surface is coated with a passivating and/or antireflective layer (second surface passivating step). Passivating and/or antireflective coatings are effected as described hereinafter.

According to certain embodiments of the invention said cap layer may function as a passivating and/or antireflective coating. In such an embodiment, cap layer removal and second surface passivating steps are optional.

In accordance to some embodiments of the invention subsequent to step (f) the substrate comprises a second surface doped with boron wherein said second surface is coated with a passivating and/or antireflective coating, and the first surface and edges of said substrate are texturized.

According to some embodiments of the invention, subsequent to the cap removal layer and second surface passivating steps, phosphorous deposition and phosphorous diffusion by a gas phase process are effected (step (g)) herein referred to as second n-doped layer Said second n-doped layer may be formed by any suitable technique known in the art for n-doping (e.g., any n-doping technique described herein), including, without limitation, gas phase diffusion, ion implantation, and/or use of an n-dopant containing layer (e.g., according to any of the respective embodiments described herein).

Preferably, said second n-doped layer is effected by exposing the substrate to $POCl_3$ in the gas phase at a temperature in the range of 700° C. to 950° C., preferably 750° C. to 900° C.

In some embodiments of any of the embodiments described herein, forming an n-doped layer (steps (d) and (g)) is effected in two stages: first exposing the substrate to $POCl_3$ in the gas phase at a temperature in the range of 700° C. to 900° C.—and second—diffusion of phosphorous into the substrate by elevating the temperature up to 950° C.

In accordance with some embodiments of the invention, subsequent to forming the second n-doped layer on said first surface, said first surface is coated with a passivating and/or antireflective coating in accordance with passivating and/or antireflective coating techniques known in the art or described herein. Optionally, a phosphosilicate glass (PSG) layer which may have formed on said first surface is removed prior to forming a passivating and/or antireflective coating on said first surface. Said removal of PSG can be carried out according to methods known in the art or described herein.

In some embodiments of the present invention a second $n^+$ layer prepared according to any of the respective embodiments described herein, is characterized by a sheet resistance in a range of from 70 to 150 Ohms/□.

As used herein and in the art, the term "Ohms" in the context of a sheet resistance is interchangeable with the terms "Ohms per square" and "Ohms/□", an accepted unit of sheet resistance which is used in the art to differentiate units of sheet resistance from units of resistance of a bulk material (although Ohm units and Ohm per square units are dimensionally equal).

In some embodiments of the present invention, a first $n^+$ layer which is removed according to any of the respective embodiments described herein is characterized by a sheet resistance of less than 70 Ohms, optionally less than 40 Ohms, for example, in a range of from 8 to 25 Ohms.

In some embodiments of the invention, texturing is carried out in order to remove a first n-doped layer from the substrate and provide the substrate surface with a relief decreasing optical reflectance and to prevent shunting at the substrate edges.

According to some embodiments of the invention, the process further comprises removing the cap layer subsequently to removing the n-doped layer on the first surface by texturing, and prior to forming the passivating and/or antireflective coating on the second surface.

Herein, a "passivating and/or antireflective coating" refers to one or more dielectric coatings, each of which has a passivating effect and/or an antireflective effect.

Forming a passivating coating on the second surface may optionally comprise leaving a SiB layer on said surface arisen during the boron drive-in process Herein, the term "SiB" refers to a combination of silicon and boron atoms, wherein a concentration of the boron atoms exceeds the solubility of boron atoms in Si at diffusion temperature (up to about 1100° C.), e.g., above about $5 \cdot 10^{20}$ atoms/cm$^3$. The term "SiB" is not intended to imply a 1:1 stoichiometry of Si to B. SiB may optionally be identified as a substance in which an absolute concentration of boron atoms (e.g., as determined by secondary ion mass spectrometry (SIMS)) is significantly greater than a concentration of electrically active (i.e., dissolved) boron atoms (e.g., as determined by electrochemical capacitance-voltage profiling (ECV)).

Additional examples of a passivating coating according to any of the respective embodiments described herein include, without limitation, layers of aluminum oxide (e.g., $Al_2O_3$) and/or silicon oxide. A passivating and/or antireflective coating (e.g., an aluminum oxide, silicon oxide, silicon nitride and/or silicon oxynitride coating) may optionally be deposited (e.g., using sputtering and/or chemical vapor deposition) and/or formed by a reaction on the substrate surface, for example, by chemical and/or thermal oxidation of silicon in the substrate to form silicon oxide and/or diffusion of boron into silicon to form SiB (e.g., as described herein). The passivating and/or antireflective may have any suitable thickness (e.g., according to any of the respective embodiments described herein).

The passivating and/or antireflective coating on the second surface may comprise a layer of silicon nitride on top of a layer of silicon oxide which coats the substrate surface. According to a further option of the invention, said passivating and/or antireflective coating comprises a silicon nitride layer on top of a layer of boron silica glass (BSG). Said BSG may be formed under elevated temperature conditions, e.g. the temperature under which diffusion of boron occurs.

The terms "silicon nitride" and "SiN", which are used herein interchangeably, refer herein to a family of substances composed substantially of silicon and nitrogen, with various stoichiometries of Si and N (e.g., $Si_3N_4$), although some amounts of additional atoms (e.g., hydrogen) may be present as impurities.

The phrase "silicon oxynitride" refers to $SiN_xO_y$, wherein each of x and y is a positive number of up to 2 (e.g., between 0.1 and 2), and x and y are in accordance with the valence requirements of Si, N and O. Some amounts of additional atoms (e.g., hydrogen) may be present as impurities.

In some embodiments, the passivating and/or antireflective coating is formed such that a border of the passivating and/or antireflective coating corresponds to a desired border of a subsequently formed second n-doped layer (according to any of the respective embodiments described herein). The passivating and/or antireflective coating may determine the border of a second n-doped layer by preventing n-doping across the border (i.e., in a region covered by the passivating and/or antireflective coating), facilitating separation (i.e., reducing overlap) of an n-doped layer and a boron-doped layer, providing high shunt resistance.

In some embodiments, forming the passivating and/or antireflective coating is effected such that the passivating and/or antireflective coating covers an edge of the substrate (i.e., a surface between the first surface and the second surface, which is optionally perpendicular to each of the first surface and second surface). In some such embodiments, the passivating and/or antireflective coating prevents formation of a n-doped layer (according to any of the respective embodiments described herein) on an edge of the substrate.

In some embodiments of any of the embodiments described herein, diffusion of the n-dopant and diffusion of the boron are effected simultaneously. In some embodiments, simultaneous diffusion of n-dopant and boron are effected by heating, optionally by exposure to a temperature in a range of from 850° C. to 1050° C.

In some embodiments of the present invention, the boron-containing layer (e.g., the thickness, boron-concentration, and composition of the layer) and conditions of diffusion (e.g., temperature and/or time of diffusion) are selected such that a concentration of boron in said doped layer is less than $10^{21}$ atoms/cm$^3$, optionally less than $3 \cdot 10^{20}$ atoms/cm$^3$, optionally less than $10^{20}$ atoms/cm$^3$, optionally less than $3 \cdot 10^{19}$ atoms/cm$^3$ and optionally less than $10^{19}$ atoms/cm$^3$.

Herein, a concentration in a doped layer, in units of amount (e.g., atoms) per volume (e.g., cm$^3$ units) refers to a maximal concentration in a doped layer of the substrate (e.g., a maximal concentration at any depth up to a depth of about 1 µm).

In some embodiments the boron-containing layer (e.g., the thickness, boron-concentration, and composition of the layer) and conditions of diffusion (e.g., temperature and/or time of diffusion) are selected such that doping of that layer with boron forms an p$^+$ layer characterized by a sheet resistance according to any of the respective embodiments described herein, e.g., in a range of from 15 to 300 ohms, from 30 to 300 ohms, from 30 to 200 ohms and/or from 30 to 150 ohms.

The skilled person will be readily capable of modulating conditions (e.g., temperature and/or duration of thermal treatment, and/or amount of dopant in a dopant-containing layer) to arrive at a desired amount (e.g., concentration) of dopant (e.g., boron) and/or sheet resistance (which is affected by amount of dopant) in that p$^+$ layer, according to any of the respective embodiments described herein.

In some embodiments wherein a boron-containing layer is formed prior to an n-dopant-containing layer, the process further comprises etching the first surface subsequent to formation of the boron-containing layer and prior to formation of the n-dopant-containing layer. In some embodiments, such etching is performed so as to remove any boron-containing layer present on the first surface. In some embodiments the process comprises forming a cap layer (according to any of the respective embodiments described herein) above the boron-containing layer on the second surface, for example, a cap layer selected to protect the boron-containing layer on the second surface during etching of the first surface.

Figure 3:
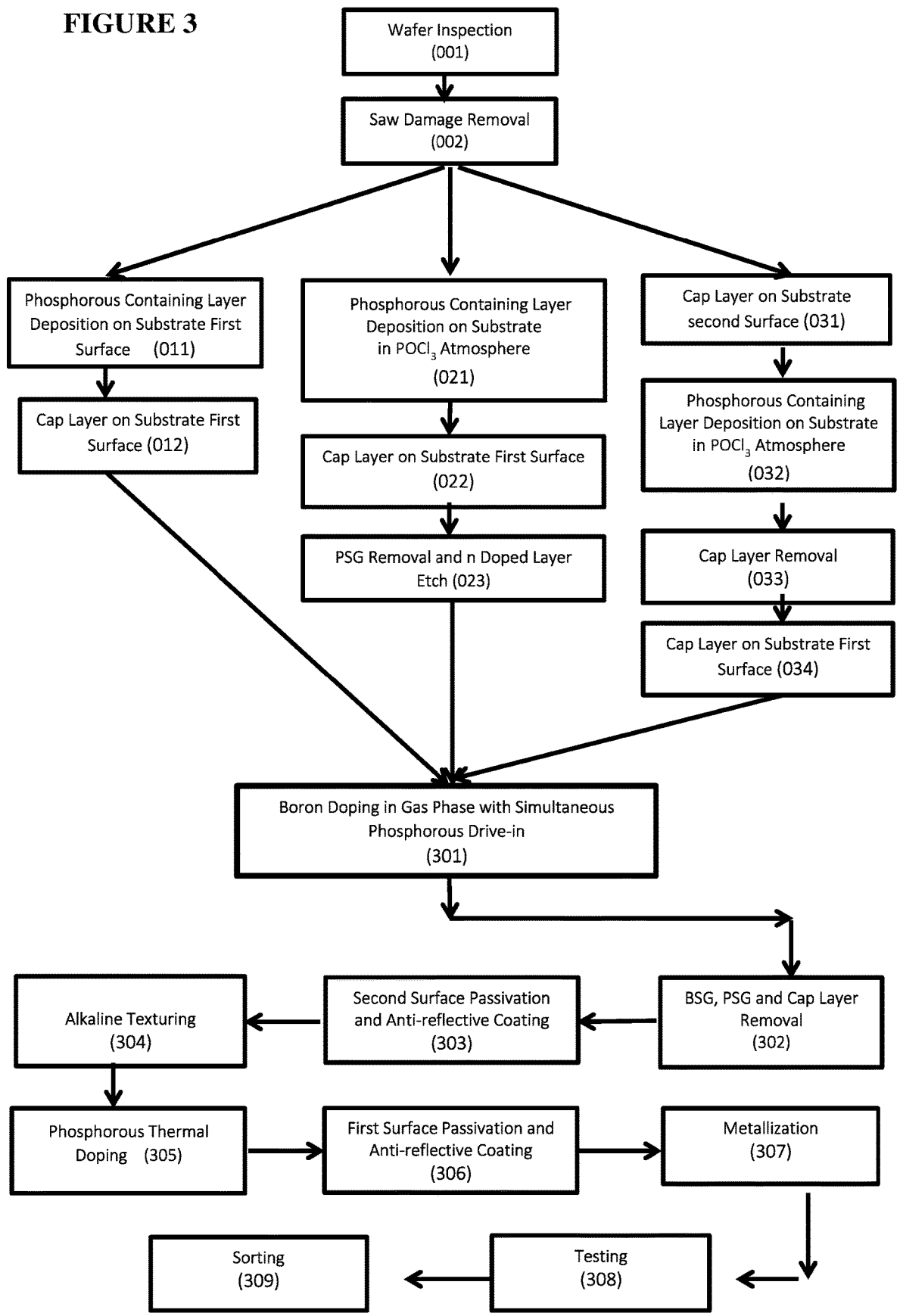
FIG. 3—A block diagram of the process (i) to (vii).
Figure 4A:
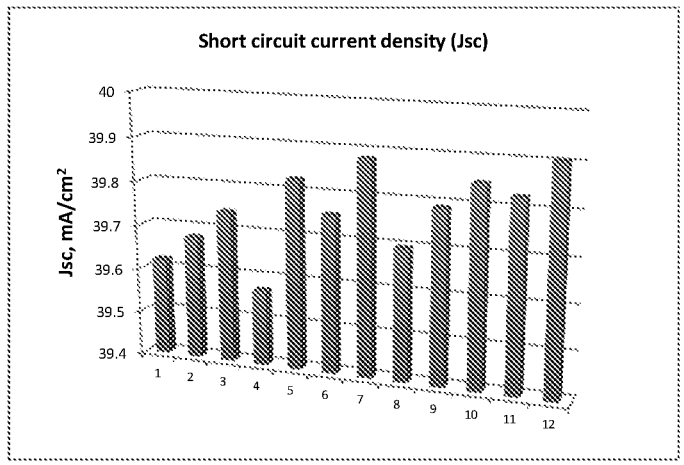
FIG. 4A—the short circuit current density (Jsc) curve measurement results are shown for cells produced according to the invention.
Figure 4B:
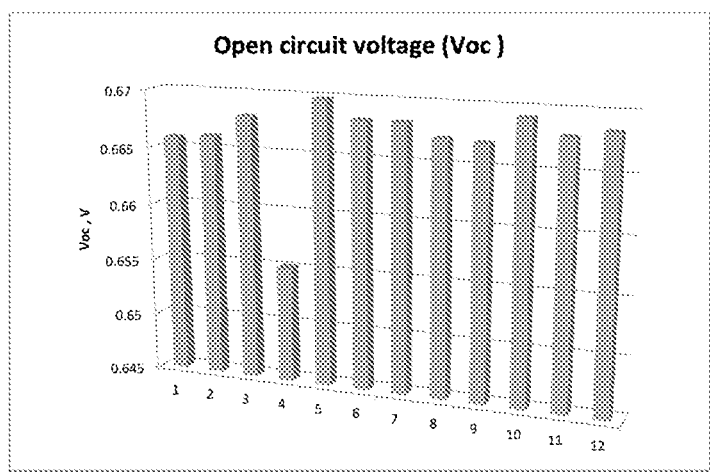
FIG. 4B—the Open circuit voltage (Voc) results are shown for one batch of cells produced according to the invention.
Figure 4C:
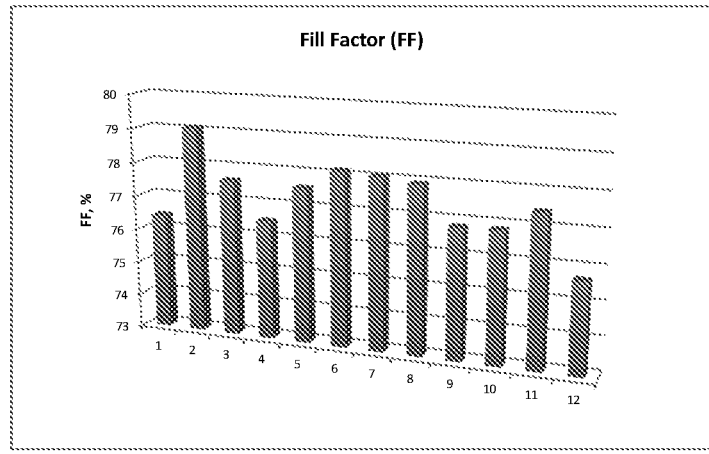
FIG. 4C—the Fill factor (FF) results are shown for one batch of cells produced according to the invention.
Figure 4D:
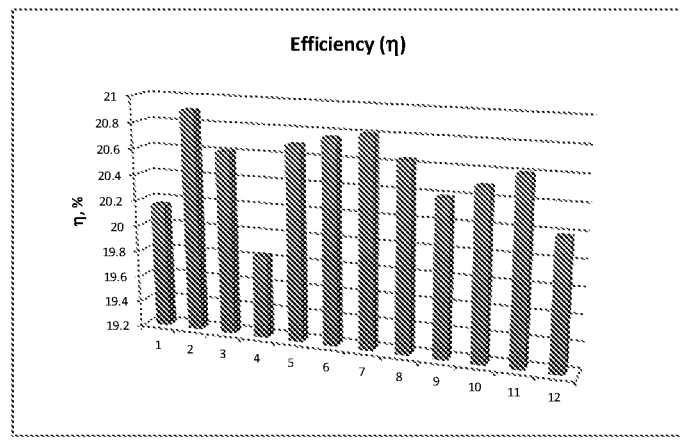
FIG. 4D—the Efficiency ($\eta$) results are shown for one batch of cells produced according to the invention.

The present invention further provides a process for the manufacturing of a bifacial photovoltaic cell comprising the following step with reference to FIG. 3 (Numbers in parenthesis correlate to the block numbers in the figures):

i. Forming a coated substrate wherein said substrate comprises an n-dopant containing layer on substrate's first surface wherein said n-dopant containing layer on substrate's first surface is coated with a cap layer.

ii. Effecting doping of the substrate with a p-dopant on the surfaces of said substrate which are not protected by the cap layer, concomitantly with effecting the drive-in (diffusion) into the substrate of the n-dopant from said n-dopant containing layer (301).

iii. Removing the cap layer from said first surface of the substrate (302).

iv. Forming a passivating and/or antireflective layer on the substrate's second surface (303).

v. Texturing the surface and edges of the substrate which are not covered by a passivating and/or antireflective layer (304).

vi. Effecting the deposition of a n-dopant containing layer on the first surface of said substrate and diffusion of said n-dopant into the substrate to form a second n-doped layer (305).

vii. Forming a passivating and/or antireflective layer on the first surface of the substrate (306).

In accordance with certain embodiments of the present invention with reference to FIG. 3, step (i) of forming a coated substrate wherein said substrate comprises an n-dopant containing layer on substrate's first surface wherein said n-dopant containing layer on substrate's first surface is coated with a cap layer, is carried out by effecting the deposition of an n-dopant containing layer on the first surface of the substrate (011) and coating said n-dopant containing layer with a cap layer (012).

In accordance with further embodiments of the present invention, step (i) of forming a coated substrate wherein said substrate comprises an n-dopant containing layer on substrate's first surface wherein said n-dopant containing layer on substrate's first surface is coated with a cap layer, is carried out by exposing the substrate to an n-dopant in the gas phase to deposit an n-dopant containing layer on said substrate (021) and coating said n-dopant containing layer on the first surface of the substrate with a cap layer (022). Said substrate is then subjected to etching (023) which removes the n-dopant containing layer where there is no cap layer coating and may remove n-doped layers from the substrate where there is no cap layer coating.

According to certain embodiments of the invention, the cap layer formed on the first surface of the substrate also coats the edges of the substrate.

In accordance with certain embodiments of the present invention, step (i) of forming a coated substrate wherein said substrate comprises an n-dopant containing layer on substrate's first surface wherein said n-dopant containing layer on substrate's first surface is coated with a cap layer, is carried out by coating the substrate on the second surface with a cap layer (031), exposing the substrate to an n-dopant in the gas phase to deposit an n-dopant containing layer on the substrate surfaces which are not coated with a cap layer (032), remove said cap layer from said second surface (033), coat the first surface of the substrate with a cap layer (034). According to the present embodiment of the invention, the cap layer formed on the first surface of the substrate also coats the edges of the substrate.

In some embodiments of any of the embodiments described herein, the process further comprises forming electrical contacts on each of the first surface and the second surface. Electric contacts may be formed according to methods well known in the art.

In order to allow light to reach the substrate of a bifacial photovoltaic cell, the contacts on both surfaces are preferably configured so as to allow most of the light to pass through to the substrate, thereby allowing the photovoltaic cell to produce electricity from illumination on either side of the cell. For example, the contacts may optionally be configured in a grid pattern.

In some embodiments, contacts are selectively formed (optionally using a mask) on regions of the second surface which have a greater concentration of boron than the rest of the second surface. In some embodiments, such regions are formed using a boron-containing layer which has a greater thickness and/or concentration in such regions (according to any of the respective embodiments described herein).

According to an aspect of some embodiments of the invention there is provided a bifacial photovoltaic cell prepared by the process of any one of respective embodiments described herein.

Cap Layer:

Herein, the terms "cap" and "capping" refer to a layer being above ("capping") a boron-containing layer (i.e., farther from the substrate than the boron-containing layer) and are not intended to be further limiting.

In some embodiments of the invention, a thickness of the cap layer is in a range of from 2.5 to 80 nm. In some embodiments, the thickness is in a range of from 5 to 40 nm. In some embodiments, the thickness is in a range of from 5 to 20 nm.

The cap layer may be formed according to any suitable technique known in the art for forming a cap layer according to any of the respective embodiments described herein. Examples of suitable techniques include, without limitation, sputtering (e.g., DC sputtering and/or radio frequency sputtering), physical vapor deposition and chemical vapor deposition.

Herein and in the art, "radio frequency sputtering" refers to sputtering whereby a sputtering target may optionally be subjected to a charged plasma particles, such as ionized gas (optionally using strong electric and/or magnetic fields to direct plasma particles in the general location of the target), with an alternating voltage bias (e.g., alternating at a radio frequency, such as 13.56 MHz) accelerating the plasma particles.

Herein and in the art, "DC sputtering" refers to sputtering whereby ions in a plasma are directed towards a sputtering target (to thereby bombard the target). Accelerated ions in the plasma are optionally neutralized (by an electron source) such that the target is bombarded by neutrally charged particles.

The thickness of a cap layer may be controlled, for example, by controlling the duration of a deposition process (e.g., duration of sputtering). Control over the thickness of the cap layer may optionally be utilized to allow control over properties of the cap layer, for example, permeability to boron, n-dopant and/or etching solution.

In some embodiments the cap layer comprises an inert substance. The cap layer is optionally formed by deposition of a layer of the inert substance, optionally by sputtering (e.g., DC and/or radio frequency sputtering).

Examples of inert substances suitable for forming a cap layer include, without limitation, silicon nitride, silicon oxynitride and silicon oxide.

In some embodiments of the present invention the selection of a cap layer having certain properties (according to any of the respective embodiments described herein), may optionally be by effecting formation of a cap layer having a thickness sufficient to result in the indicated properties, for example, a thickness of at least 5 nm (optionally up to 40 nm, according to any of the respective embodiments described herein). Alternatively or additionally, selection may optionally be effected by comparing results of different cap layer compositions (e.g., silicon nitride, silicon oxide and/or silicon oxynitride) and/or different methodologies of cap layer formation (according to any of the respective embodiments described herein).

In some embodiments forming a cap layer above the boron-containing layer is effected prior to effecting diffusion (e.g., by thermal treatment). In some embodiments, forming the cap layer above the boron-containing layer is effected prior to deposition of phosphorus-containing (n-dopantcontaining) layer. In such embodiments, the cap layer protects the boron-containing layer (e.g., until diffusion is effected).

In some embodiments according to any of the embodiments described herein, the cap layer is selected such that it prevents removing of the boron doped layer from the second surface by texturing (according to any of the respective embodiments described herein), except of the border around the edge.

In some embodiments the process further comprises removing the cap layer according to any of the respective embodiments described herein subsequently to removal of an n-doped layer by texturing (according to any of the respective embodiments described herein). In according with a further embodiment of the invention said cap layer removal is prior to forming a passivating and/or antireflective coating according to any of the respective embodiments described herein. Removal of the cap layer can be carried out by means and methods known to the skilled person in the art, for example by chemical means, including but not limited to the use of an HF solution. In some such embodiments, the cap layer protects the boron-doped layer from the texturing process.

In some embodiments described herein, the cap layer is selected such that it reduces an amount of boron which escapes into the surrounding atmosphere upon effecting diffusion of boron according to any of the respective embodiments described herein (i.e., in comparison to an amount of boron which escapes into the surrounding atmosphere, under the same conditions, in the absence of the cap layer).

In some embodiments, the cap layer is selected such that no more than 5% of boron in the boron-containing layer escapes into the surrounding atmosphere upon effecting the diffusion of said boron. In some embodiments, the cap layer is selected such that no more than 3% of boron in the boron-containing layer escapes into the surrounding atmosphere upon effecting the diffusion of said boron. In some embodiments, the cap layer is selected such that no more than 2% of boron in the boron-containing layer escapes into the surrounding atmosphere upon effecting the diffusion of said boron. In some embodiments, the cap layer is selected such that no more than 1% of boron in the boron-containing layer escapes into the surrounding atmosphere upon effecting the diffusion of said boron. In some embodiments, the cap layer is selected such that no more than 0.5% of boron in the boron-containing layer escapes into the surrounding atmosphere upon effecting the diffusion of said boron. In some embodiments, the cap layer is selected such that no more than 0.3% of boron in the boron-containing layer escapes into the surrounding atmosphere upon effecting the diffusion of said boron. In some embodiments, the cap layer is selected such that no more than 0.2% of boron in the boron-containing layer escapes into the surrounding atmosphere upon effecting the diffusion of said boron. In some embodiments, the cap layer is selected such that no more than 0.1% of boron in the boron-containing layer escapes into the surrounding atmosphere upon effecting the diffusion of said boron. In some embodiments, the cap layer is selected such that no more than 0.05% of boron in the boron-containing layer escapes into the surrounding atmosphere upon effecting the diffusion of said boron. In some embodiments, the cap layer is selected such that no more than 0.03% of boron in the boron-containing layer escapes into the surrounding atmosphere upon effecting the diffusion of said boron. In some embodiments, the cap layer is selected such that no more than 0.02% of boron in the boron-containing layer escapes into the surrounding atmosphere upon effecting the diffusion of said boron. In some embodiments, the cap layer is selected such that no more than 0.01% of boron in the boron-containing layer escapes into the surrounding atmosphere upon effecting the diffusion of said boron.

In some embodiments, the cap layer is selected such that it reduces an amount of boron which diffuses into the first surface of the substrate upon effecting diffusion of boron according to any of the respective embodiments described herein (i.e., in comparison to an amount of boron which diffuses into the first surface, under the same conditions, in the absence of the cap layer).

In some embodiments, forming each of the boron-containing layer and cap layer above the boron-containing layer (on the second surface of the substrate) is effected prior to forming the n-dopant-containing layer (on the first surface of the substrate). In some such embodiments, the cap layer (which is formed prior to the n-dopant-containing layer) is selected such that it reduces an amount of n-dopant (e.g., phosphorus) which diffuses into the second surface of the substrate upon effecting diffusion of the n-dopant and boron according to any of the respective embodiments described herein (i.e., in comparison to an amount of n-dopant which diffuses into the second surface, under the same conditions, in the absence of the cap layer).

In some embodiments, the cap layer is formed such that a border of the cap layer corresponds to a desired border of an n-doped layer (according to any of the respective embodiments described herein). The cap layer may optionally determine the border of an n-doped layer by preventing n-doping across the border (i.e., in a region covered by the cap layer), for example, facilitating separation (i.e., reducing overlap) of an n-doped layer and a boron-doped layer, which can enhance shunt resistance.

In some embodiments described herein, forming the cap layer is effected such that the cap layer covers an edge of the substrate (i.e., a surface between the first surface and the second surface, which is optionally perpendicular to each of the first surface and second surface), and optionally covers all of the edges of the substrate. In some such embodiments, the cap layer prevents formation of an n-doped layer (according to any of the respective embodiments described herein) on an edge of the substrate.

The Photovoltaic Cell

According to some embodiments of the present invention there is provided a bifacial photovoltaic cell comprising a semiconductor substrate (e.g., silicon), the substrate comprising an $n^+$ layer on a first surface thereof and a $p^+$ layer on a second surface thereof, the $n^+$ layer comprising an n-dopant (e.g., phosphorus) and the $p^+$ layer comprising boron. Preferably, the photovoltaic cell further comprises electrical contacts on each of said first surface and said second surface, which are suitable for a bifacial cell (e.g., the contacts do not cover a large proportion of either surface). In some embodiments, the bifacial photovoltaic cell is prepared by a process described herein in any of the respective embodiments and any combination thereof.

In some embodiments described herein for a bifacial photovoltaic cell, a concentration of boron in a $p^+$ layer is less than $3 \cdot 10^{20}$ atoms/cm$^3$, optionally less than $10^{20}$ atoms/cm$^3$, optionally less than $3 \cdot 10^{19}$ atoms/cm$^3$ and optionally less than $10^{19}$ atoms/cm$^3$.

According to some embodiments, a specific shunt resistance of the photovoltaic cell is at least 5,000 Ohm*cm$^2$ (i.e., Ohm multiplied by cm$^2$), optionally at least 5,500 Ohm*cm$^2$, optionally at least 6,000 Ohm*cm$^2$, optionally at least 6,500 Ohm*cm$^2$, and optionally at least 7,000 Ohm*cm$^2$. As specific shunt resistance may depend on the area and shape of a photovoltaic cell, the aforementioned specific shunt resistance may be determined for a photovoltaic cell having an area of about 240 cm$^2$ and being substantially square (i.e., having a circumference of about 61 cm).

Without being bound by any particular theory, it is believed that known techniques for enhancing shunt resistance (e.g., laser edge isolation) are less effective (and even deleterious) in high-efficiency cells.

In some embodiments the p$^+$ layer is characterized by a sheet resistance according to any of the respective embodiments described herein, e.g., in a range of from 15 to 300 Ohms, from 30 to 300 Ohms, from 50 to 200 Ohms and/or from 70 to 150 Ohms.

In some embodiments, the first surface is texturized.

In some embodiments described herein, the second surface is texturized. Optionally the first and second surfaces are both texturized.

In some embodiments of the present invention the photovoltaic cell further comprises a passivating and/or antireflective coating (according to any of the embodiments described herein) on at least a portion of the second surface, optionally the entire second surface. In some embodiments, this passivating and/or antireflective coating covers also at least a portion of, and optionally all of, the edges of the substrate; and optionally covers a portion of the first surface bordering an edge of the substrate (e.g., an area of the first surface having a width of up to 0.5 mm, optionally from 0.1-0.5 mm, bordering the edge).

In some embodiments, the photovoltaic cell further comprising another passivating and/or antireflective coating (according to any of the embodiments described herein) on at least a portion of the first surface, optionally the entire first surface. In some embodiments, the same passivating and/or antireflective coating covers at least a portion of each of the first surface and the second surface, and optionally the entire first surface and second surface. A passivating and/or antireflective coating on the first surface may be the same as, or different than a passivating and/or antireflective coating on the second surface.

In some embodiments, a total thickness of passivating and antireflective coating (according to any of the embodiments described herein) is in a range of from 1 to 90 nm, optionally in a range of from 2 to 80 nm, and optionally in a range of from 5 to 75 nm.

Examples of passivating and/or antireflective coatings according to any of the respective embodiments described herein include, without limitation, coatings comprising silicon oxide, silicon nitride, silicon oxynitride, $TiO_2$, $ZrO_2$, and/or $Ta_2O_5$. When more than one layer is present in a passivating and/or antireflective coating, the different layers may differ, for example, in refractive index (e.g., an upper layer having a lower refractive index than a lower layer) and/or components (e.g., one layer comprising silicon oxynitride and another layer comprising silicon nitride).

In some embodiments an n$^+$ layer of the photovoltaic cell prepared according to any of the respective embodiments described herein, is characterized by a sheet resistance in a range of from 70 to 150 Ohms.

In some embodiments a concentration of boron in a p$^+$ layer (according to any of the respective embodiments described herein) is greater in regions underlying said electrical contacts on said second surface. In some embodiments, a concentration of boron in regions underlying said electrical contacts is at least 100% (twice) greater than a concentration of boron in the rest of the p$^+$ layer. In some embodiments, a concentration of boron in regions underlying said electrical contacts is at least 200% (3-fold) greater than a concentration of boron in the rest of the p$^+$ layer. In some embodiments, a concentration of boron in regions underlying said electrical contacts is at least 400% (5-fold) greater than a concentration of boron in the rest of the p$^+$ layer. In some embodiments, a concentration of boron in regions underlying said electrical contacts is at least 900% (10-fold) greater than a concentration of boron in the rest of the p$^+$ layer.

In some embodiments the photovoltaic cell further comprises a SiB layer on the second surface, optionally a SiB layer prepared according to any of the respective embodiments described herein. The SiB layer may optionally be a passivating coating according to any of the respective embodiments described herein.

According to some embodiments of the present invention, a p$^+$ layer (according to any of the respective embodiments described herein) is characterized by a sheet resistance of at least 15 Ohms☐. In some embodiments, the sheet resistance of a p$^+$ layer is in a range of from 15 to 300 Ohms☐. In some embodiments, the sheet resistance of a p$^+$ layer is in a range of from 50 to 200 Ohms☐. In some embodiments, the sheet resistance of a p$^+$ layer is in a range of from 70 to 150 Ohms☐.

According to some embodiments, a p$^+$ layer of the photovoltaic cell does not cover an area bordering an edge of the substrate thereof, the area having a width in a range of 0.1-0.5 mm. Such an area may optionally be prepared by masking and/or etching the second surface, according to any of the respective embodiments described herein.

In any of the embodiments described herein (according to any of the aspects described herein), the semiconductor substrate comprises silicon, and optionally consists essentially of doped silicon (e.g., p-type or n-type silicon).

In any of the embodiments described herein (according to any of the aspects described herein), the semiconductor substrate may optionally be an n-type semiconductor (e.g., n-doped silicon), such that the photovoltaic cell has a p$^+$-n-n$^+$ structure; or a p-type semiconductor (e.g., p-doped silicon), such that the photovoltaic cell has a n$^+$-p-p$^+$ structure.

In some embodiments described herein, an effective back surface recombination of the photovoltaic cell (according to any of the respective embodiments described herein) is less than 150 cm/second. In some embodiments, the effective back surface recombination is less than 100 cm/second. In some embodiments, the effective back surface recombination is less than 60 cm/second. In some embodiments, the effective back surface recombination is less than 30 cm/second. In some embodiments, the effective back surface recombination is less than 20 cm/second. In some embodiments, the effective back surface recombination is less than 10 cm/second. In some embodiments, the effective back surface recombination is less than 5 cm/second.

Effective surface recombination (e.g., of the back surface) may be determined according to any suitable technique known in the art, for example, by measuring spectral internal quantum efficiency upon illumination (e.g., of the back side). Optionally, effective surface recombination is determined as described in Eisenberg et al. [*Energy Procedia* 2016, 92:16-23], the contents of which are incorporated herein by reference (especially contents relating to measurement of surface recombination).

In some embodiments, a front side efficiency of the photovoltaic cell (according to any of the respective embodiments described herein) is at least 19%. In some embodiments, the front side efficiency is at least 19.5%. In some embodiments, the front side efficiency is at least 20%. In some embodiments, the front side efficiency is at least 20.5%. In some embodiments, the front side efficiency is at least 21%. In some embodiments, the front side efficiency is at least 21.5%. In some embodiments, the front side efficiency is at least 22%.

Herein, the phrase "front side efficiency" refers to efficiency (as described herein) of the photovoltaic cell under conditions wherein only one (front) side of the cell is exposed to illumination (e.g., wherein the other side is placed on a black opaque surface). The "front side" exposed to illumination is defined as whichever side is characterized by the higher efficiency.

The efficiency of a cell (e.g., with respect to illumination of any given side thereof) may be determined by determining the maximal power output of the cell, and dividing by the input light irradiance, at standard test conditions.

In some embodiments described herein, an open circuit voltage of the photovoltaic cell (according to any of the respective embodiments described herein) is at least 620 mV. In some embodiments, the open circuit voltage is at least 630 mV. In some embodiments, the open circuit voltage is at least 640 mV. In some embodiments, the open circuit voltage is at least 650 mV. In some embodiments, the open circuit voltage is at least 660 mV. In some embodiments, the open circuit voltage is at least 670, mV. In some embodiments, the open circuit voltage is at least 680 mV In some embodiments, the open circuit voltage is at least 690 mV Physical parameters described herein relating to photovoltaic cell performance are determined by measurements at standard test conditions used in the art to evaluate photovoltaic cells. Standard test conditions include solar irradiance of 1,000 W/m$^2$, solar reference spectrum at AM (air mass) of 1.5 and a cell temperature 25° C.

In some embodiments, a ratio of back side short circuit current to front side short circuit current is at least 0.75. In some embodiments, the ratio of back side short circuit current to front side short circuit current is at least 0.8. In some embodiments, the ratio of back side short circuit current to front side short circuit current is at least 0.85. In some embodiments, the ratio of back side short circuit current to front side short circuit current is at least 0.9.

Herein, the phrase "front side short circuit current" refers to short circuit current (as described herein) of the photovoltaic cell under conditions wherein only the front side of the cell is exposed to illumination (e.g., wherein the back side is placed on a black opaque surface), and the phrase "back side short circuit current" refers to short circuit current (as described herein) of the photovoltaic cell under conditions wherein only the back side of the cell is exposed to illumination (e.g., wherein the front side is placed on a black opaque surface). The "front side" is defined as whichever side is characterized by the higher efficiency and the "back side" is defined as whichever side is characterized by the lower efficiency (determined as described herein).

Short circuit current ($I_{SC}$) may be determined, for example, by measuring the current produced by the photovoltaic cell at short circuit (i.e., voltage=0) using standard techniques of the art.

As the back side is (by definition) less efficient than the front side, a ratio of back side short circuit current to front side short circuit current is typically less than 1, optionally less than 0.95.

Without being bound by an particular theory, it is believed that a relatively high ratio of back side short circuit current to front side short circuit current (e.g., as described herein) is associated with a superior rear side design (e.g., the p$^+$ layer in a p$^+$-p-n$^+$ structure), characterized by reduction and even elimination of over-doping, and/or low effective back side recombination. It is further believed that values of other parameters described herein, such as relatively high front side efficiency, may also be improved by a superior rear side design.

According to another aspect of embodiments of the invention, there is provided a photovoltaic module comprising a plurality of any of the photovoltaic cells described herein, the photovoltaic cells being interconnected to one another.

As used herein, the phrase "photovoltaic module" describes a module comprising an array of photovoltaic cells, which are interconnected in series and/or in parallel. Connection of the cells in series creates a higher voltage. Connection of the cells in parallel results in a higher current. Thus, a skilled artisan can connect the cells in a manner which will provide a desired voltage and current.

The module may optionally further combine additional elements such as a sheet of glass or transparent plastic back sheet to protect the photovoltaic cell from the environment without blocking light from reaching the photovoltaic cell.

Said module may further comprise a tracking holder which orients the module in the direction of a source of light (e.g., for tracking the daily movement of the sun.

According to another aspect of embodiments of the present invention, there is provided a power plant comprising the photovoltaic modules described herein. The power plant optionally comprises a plurality of photovoltaic modules positioned so as to maximize their exposure to sunlight.

It is to be appreciated that an optimal position and orientation of a photovoltaic module including the bifacial photovoltaic cells described herein may be different than an optimal position of an array of monofacial photovoltaic cells.

According to another aspect of embodiments of the present invention, there is provided an electric device comprising a photovoltaic cell according to any of the respective embodiments described herein. The electric device may be configured such that both sides of the bifacial photovoltaic cell are exposed to light (e.g., being at a surface of the device). In some embodiments, the photovoltaic cells are a power source for the electric device.

Exemplary applications of the photovoltaic cells and/or photovoltaic modules described herein include, but are not limited to, a home power source, a hot water heater, a pocket computer, a notebook computer, a portable charging dock, a cellular phone, a pager, a PDA, a digital camera, a smoke detector, a GPS device, a toy, a computer peripheral device, a satellite, a space craft, a portable electric appliance (e.g., a portable TV, a portable lighting device), and a cordless electric appliance (e.g., a cordless vacuum cleaner, a cordless drill and a cordless saw).

According to another aspect of embodiments of the present invention, there is provided a detector of electromagnetic radiation, the detector comprising any photovoltaic cell described herein, wherein the electromagnetic radiation is selected from the group consisting of ultraviolet, visible and infrared radiation. The detector may be used, for example, in order to detect the radiation (e.g., as an infrared detector) and/or to measure the amount of radiation (e.g., in spectrophotometry).

It is expected that during the life of a patent maturing from this application many relevant doping techniques will be developed and the scope of the term "doping" are is intended to include all such new technologies a priori.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention.

Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It will be appreciated that the embodiments described above are cited by way of example, and that the present invention is not limited to what has been particularly shown and described hereinabove. Rather, the scope of the present invention includes both combinations of the various features described hereinabove, as well as variations and modifications thereof which would occur to persons skilled in the art upon reading the foregoing description and which are not disclosed in the prior art.

EXAMPLES

Reference is now made to the following example, which together with the above descriptions illustrate some embodiments of the invention in a non-limiting fashion.

Example 1

Cell structures were prepared as per the fabrication process described in FIG. 1.

Starting material: p-type monocrystalline Czochralski silicon with resistivity in the range 3-4 Ohm·cm; pseudo-square wafers with size 6"×6" and starting thickness 180 microns.

Boron deposition was performed in $BBr_3$ atmosphere in quartz tube furnace. (no. 103)

Boron doping was performed in $POCl_3$ atmosphere in quartz tube at temperature 1020° C. (no. 106)

$p^+$ layers sheet resistance obtained were in the range 60-100 Ohm/sq.

$n^+$ layers sheet resistance obtained were about 120 Ohm/sq.

Figure 2:
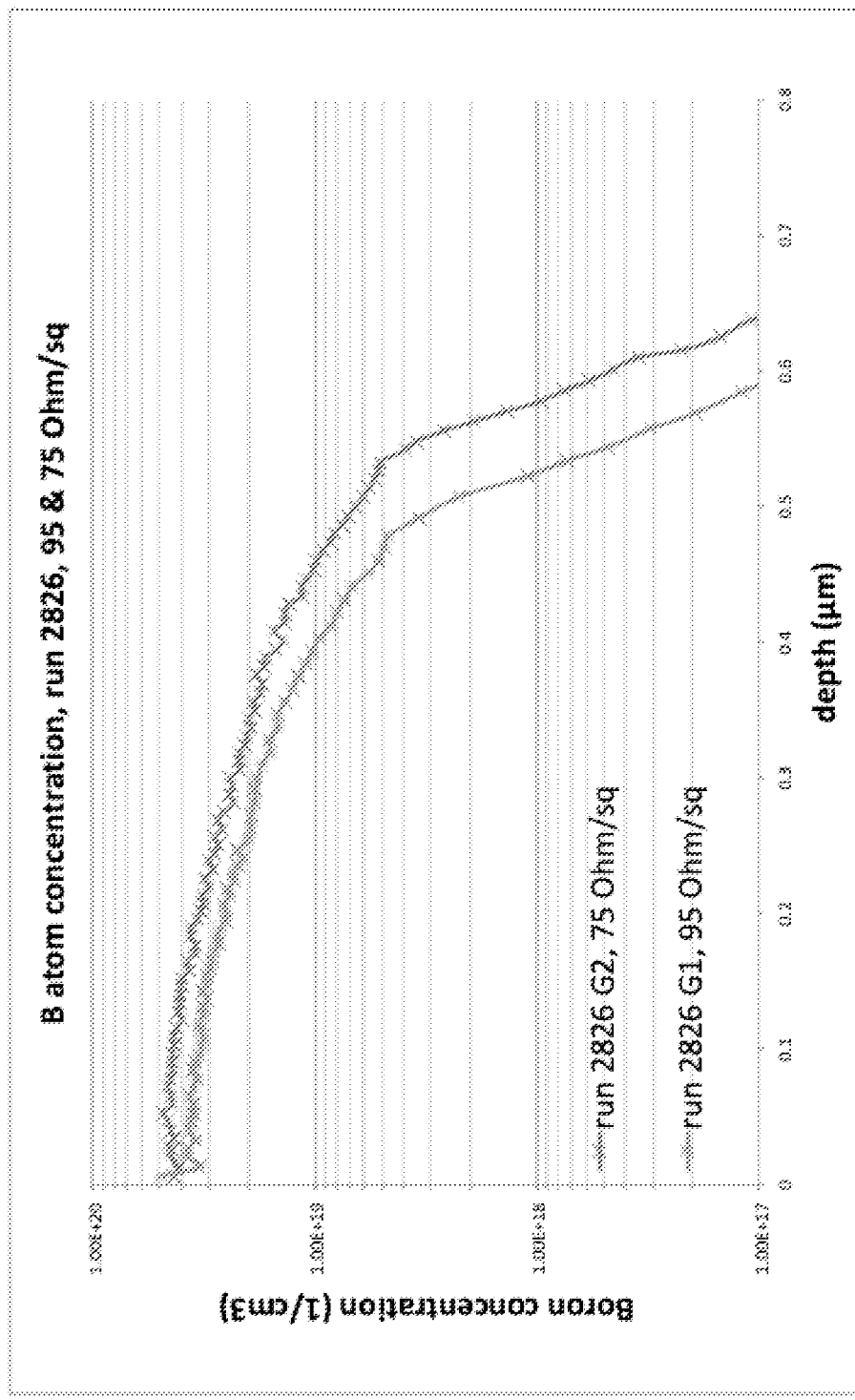
FIG. 2—Boron doped layer profile relating to two separate runs according to example 1.

FIG. 2 shows the boron doped layer profile for two runs of the process.

Implied open circuit voltage, $iV_{oc}$, was measured using Quasi Steady State Photoconductivity Decay (QSSPCD) technique. The measurement tool was WCT-120 Silicon Wafer Lifetime Tester (Sinton Consulting Inc.). Table 1 reflects the results of measurements of solar cell structures with sheet resistivity of $n^+$-layer 120 Ohm/□ and different sheet resistivity values of $p^+$-layer. The data shown in the table, demonstrate the high recombination quality of the structures, fabricated according to described technology.

The corresponding lifetime of the bulk minority carrier lifetime, at injection level of $2.10^{15}$ are in the range 0.4 to 0.7 ms.

TABLE 1

| | | | |
|---|---|---|---|
| $p^+$ layer sheet resistance, $R_{sh}$, Ω/□ | 60 | 75 | 95 |
| Implied open circuit voltage, $iV_{oc}$, mV | 684-691 | 685-693 | 686-695 |

Efficiency of the fabricated solar cells using these structures is in the range of 20.7 to 20.9% with a bifaciality factor above 90%.

Example 2—Bifacial PV Cell Preparation

Cell structures were prepared as per the fabrication process described in FIG. 3.

Starting material: p-type monocrystalline Czochralski silicon with resistivity in the range 3-4 Ohm·cm; pseudo-square wafers with size 6"×6" and starting thickness 180 microns.

Boron doping was performed in $BBr_3$ atmosphere in quartz tube at temperature 1020° C.

$p^+$ layers sheet resistance obtained were in the range 100-110 Ohm/sq.

n+ layers sheet resistance obtained were about 120 Ohm/sq.

Implied open circuit voltage, $iV_{oc}$, was measured using Quasi Steady State Photoconductivity Decay (QSSPCD) technique. The measurement tool was WCT-120 Silicon Wafer Lifetime Tester (Sinton Consulting Inc.). Table 2 reflects the results of measurements of solar cell structures with sheet resistivity of n+-layer 120 Ohm/□. The data shown in the table, demonstrate the high recombination quality of the structures, fabricated according to described technology.

The corresponding lifetime of the bulk minority carrier lifetime, at injection level of $2 \cdot 10^{15}$ cm$^{-3}$ are in the range 450 to 780 μs.

TABLE 2

| | |
|---|---|
| p+ layer sheet resistance, $R_{sh}$, Ω/□ | 100-110 |
| Implied open circuit voltage, $iV_{oc}$, mV | 688-696 |

Referring to FIGS. 4a-d, IV curve measurement results for several cells are shown.

The invention claimed is:

1. A process for the manufacturing of a bifacial photovoltaic cell comprising:
   a. coating a substrate with a boron containing layer;
   b. forming a cap layer over the boron containing layer which is on the second surface of said substrate;
   c. removing said boron containing layer from the surfaces of said substrate which are not covered with the cap layer;
   d. effecting the deposition of a phosphorous containing layer on the surfaces of said substrate which are not covered by said cap layer, and effecting diffusion of the phosphorous and the boron into the substrate;
   e. removing said phosphorous containing layer;
   f. texturing the substrate where there is no cap layer; followed by the steps of;
      i. removing said cap layer from said substrate second surface, and
      ii. forming a passivating and/or antireflective layer on substrate second surface;
   g. effecting the deposition of a phosphorous containing layer on the first surface of said substrate and effecting diffusion of phosphorous into the substrate to form a second n-doped layer;
   h. forming a passivating and/or antireflective coating layer covering the n-doped layer on said substrate's first surface.

2. A process according to claim 1 comprising:
   a. coating a substrate with a boron containing layer using $BCl_3$ or $BBr_3$ in the gas phase and effecting partial drive in of boron into said substrate;
   b. forming a cap layer over the boron containing layer which is on the second surface of the said substrate;
   c. removing the boron containing layer from the surfaces of the substrate which are not covered with the cap layer;
   d. effecting the deposition of a phosphorous containing layer on the surfaces of said substrate which are not covered by said cap layer and effecting diffusion of the phosphorous and the boron into the substrate, wherein said deposition of said phosphorous containing layer is effected by using $POCl_3$ in the gas phase;
   e. removing said phosphorous containing layer;
   f. texturing the substrate's surfaces which are not covered with a cap layer, wherein said texturing also removes the boron and phosphorous doped substrate layers, followed by the steps of;
      i. removing said cap layer from said substrate second surface, and
      ii. Forming a passivating and/or antireflective layer on said substrate's second surface;
   g. effecting the deposition of a phosphorous containing layer on the first surface of said substrate and effecting diffusion of phosphorous into the substrate to form a second n-doped layer, wherein said deposition of said phosphorous containing layer is effected by using $POCl_3$ in the gas phase;
   h. forming a coating layer covering the n-doped layer on the substrate's first surface wherein said coating layer is a passivating and/or antireflective layer.

3. A process according to claim 1, wherein said phosphorous containing layer is effected by exposing the substrate to $POCl_3$ in the gas phase.

4. A process according to claim 1, wherein diffusion into the substrate of the boron and phosphorous is effected using the temperature range of 700° C. to 1050° C.

5. A process according to claim 4, wherein diffusion into the substrate of the boron and phosphorous is effected using the temperature range of 750° C. to 1020° C.

6. A process according claim 1, wherein forming an n-doped layer is effected in two stages: first—forming on the surface of the substrate the phosphorous containing layer, and second—diffusion of phosphorous into the substrate by elevating the temperature.

7. A process according to claim 1, wherein the deposition of a phosphorous containing layer and the diffusion of the phosphorous into the substrates is simultaneous.

8. A process according to claim 1, wherein diffusion of the n-dopant and diffusion of the boron are effected simultaneously, by heating the substrate to a temperature in a range of from 850° C. to 1050° C.

9. A process according claim 1, further comprising a step of chemical edge isolation which is carried out after step (g) or step (h)).

10. A bifacial photovoltaic cell comprising a semiconductor substrate, the substrate comprising an n+ layer on a first surface thereof and a p+ layer on a second surface thereof, the n+ layer comprising an n-dopant and the p+ layer comprising boron, obtainable by a process of claim 1.

11. A bifacial photovoltaic cell according to claim 10 having a concentration of boron in a p+ layer less than the range of $3 \cdot 10^{20}$ to $10^{19}$ atoms/cm$^3$.

12. A bifacial photovoltaic cell according to claim 10, having a specific shunt resistance of the photovoltaic cell at least within the range of 5,000 Ohm*cm$^2$ to 7,000 Ohm*cm$^2$.

13. A photovoltaic module comprising a plurality of the photovoltaic cells of claim 10, wherein said photovoltaic cells are interconnected to one another.

* * * * *